(12) United States Patent
Chen et al.

(10) Patent No.: US 7,082,038 B2
(45) Date of Patent: Jul. 25, 2006

(54) FRONT COVER PROTECTOR

(75) Inventors: Pei Chen, Taipei (TW); Pi-Yun Lee, Taipei (TW)

(73) Assignee: Tatung Co., Ltd., Taipei (TW)

( * ) Notice: Subject to any disclaimer, the term of this patent is extended or adjusted under 35 U.S.C. 154(b) by 233 days.

(21) Appl. No.: 10/889,106

(22) Filed: Jul. 13, 2004

(65) Prior Publication Data

US 2005/0122702 A1    Jun. 9, 2005

(30) Foreign Application Priority Data

Nov. 14, 2003   (TW) .............................. 92220226 U

(51) Int. Cl.
*H05K 7/14* (2006.01)
*E05B 65/46* (2006.01)

(52) U.S. Cl. ...................................... 361/796; 312/216

(58) Field of Classification Search ................ 361/797, 361/801, 802, 754, 756, 799, 759, 747, 741, 361/732, 726, 683–686
See application file for complete search history.

(56) References Cited

U.S. PATENT DOCUMENTS

| | | | | |
|---|---|---|---|---|
| 5,946,196 A * | 8/1999 | Baek | ........................... | 361/798 |
| 6,327,160 B1 * | 12/2001 | Liao | ........................... | 361/809 |
| 6,567,275 B1 * | 5/2003 | Hou et al. | ................... | 361/807 |
| 6,621,714 B1 * | 9/2003 | Li et al. | ..................... | 361/801 |
| 6,937,481 B1 * | 8/2005 | Newman et al. | ............ | 361/801 |

* cited by examiner

*Primary Examiner*—Armand Cuneo
*Assistant Examiner*—Hung Nguyen
(74) *Attorney, Agent, or Firm*—Bacon & Thomas

(57) ABSTRACT

For a front cover protector mounted on a housing of a server, the protector includes: two connecting mechanisms fixed on the server by at least one screw,; two shields covering the screw and fixed on the connecting mechanism by at least one fixing screw; a front cover covering a front face of the server, comprising a fastening mechanism and being locked on the connecting mechanism by a locking element to cover the fixing screw on the shield. The front cover protector can prevent the important parts of the server from being stolen or damaged.

9 Claims, 7 Drawing Sheets

FRONT COVER PROTECTOR

BACKGROUND OF THE INVENTION

1. Field of the Invention

The present invention relates to a front cover protector and, more particularly, to a front cover protector used for a server.

2. Description of the Related Art

In order to protect the parts assembled in a server, the server usually has a front cover protector to prevent the important parts of the server from being stolen or damaged.

Please refer to FIG. 1. A prior art front cover safety mechanism of a server 130 is composed of a panel cover 120 and a pair of connecting mechanisms 110. The connecting mechanisms 110 are fixed on a front face panel of the server 130 with a plurality of screws 111, and the panel cover 120 is fastened onto the connecting mechanisms 110. Finally, a locking mechanism 121 of the panel cover 120 locks the panel cover 120 to the connecting mechanisms 110. However, this prior art front cover safety mechanism still can be compromised by unscrewing the screws 111. The safety mechanism will still be destroyed and so the important parts in a server still can be taken out.

Therefore, it is desirable to provide a front cover protector to mitigate and/or obviate the aforementioned problems.

SUMMARY OF THE INVENTION

A main objective of the present invention is to provide a front cover protector to protect the important parts in the server, and prevent the important parts of the server from being stolen or damaged.

In order to achieve the above mentioned objective, the front cover protector of the present invention is mounted on a housing of a server and comprises: two connecting mechanisms being in a U shape, forming a first side board, a second side board and a bottom board, the bottom boards being fixed respectively on a corresponding first front side board and a second front side board of the server by at least one screw, and forming at least one fixing hole on the first side board; at least one shield mounted inside the connecting mechanisms and having a bottom face and a first side face, the bottom face covering the screw on the bottom board of the connecting mechanism and forming a related hole corresponding to the fixing hole of the first side board; a fixing screw disposed through the fixing hole of the connecting mechanism and the related hole of the shield to mount the shield to the connecting mechanism; a front cover having a first fastening mechanism, a first assembly fastening mechanism and a first locking element, wherein the front cover covers a front face of the server and the fixing screw; a second fastening mechanism mounted outside of the first front face of the server corresponding to the first fastening mechanism and stuck with the first fastening mechanism, and connected to the connecting mechanism or the shield; a second assembly fastening mechanism mounted outside of the second front face of the server corresponding to the first assembly fastening mechanism and stuck with the first assembly fastening mechanism, and connected to the connecting mechanism or the shield; and a second locking element connected to the connecting mechanism or the shield corresponding to the first locking element and locked with the first locking element.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
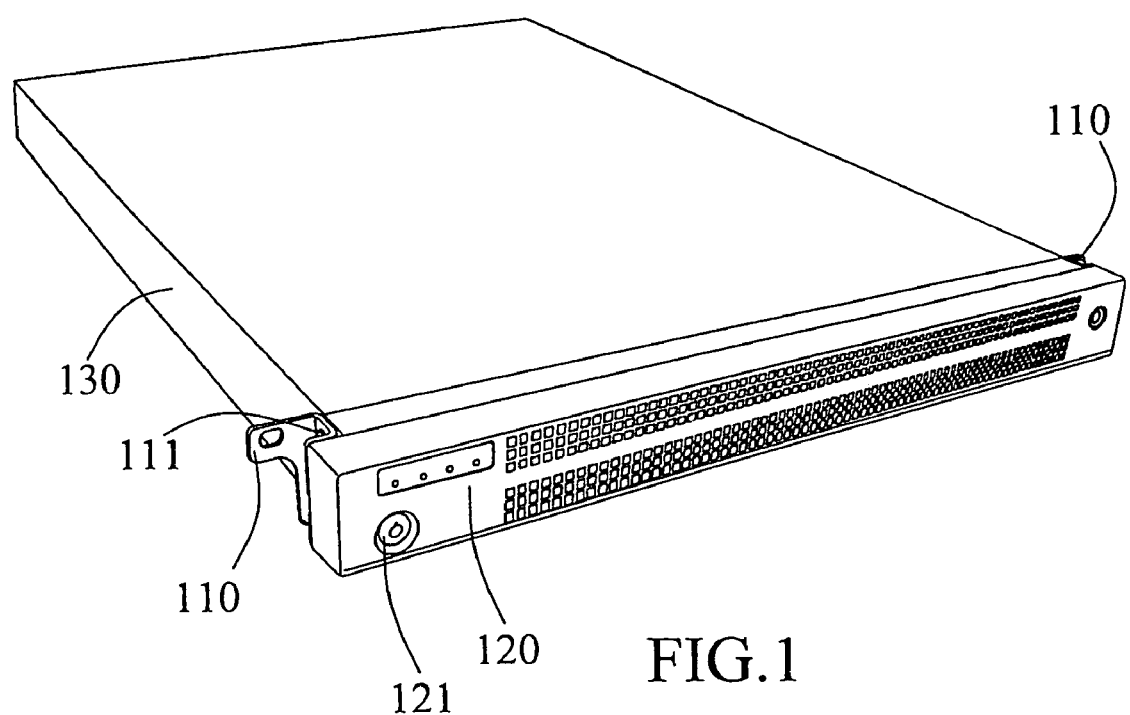
FIG. 1 is schematic drawing of a prior art front cover protector.
Figure 2:
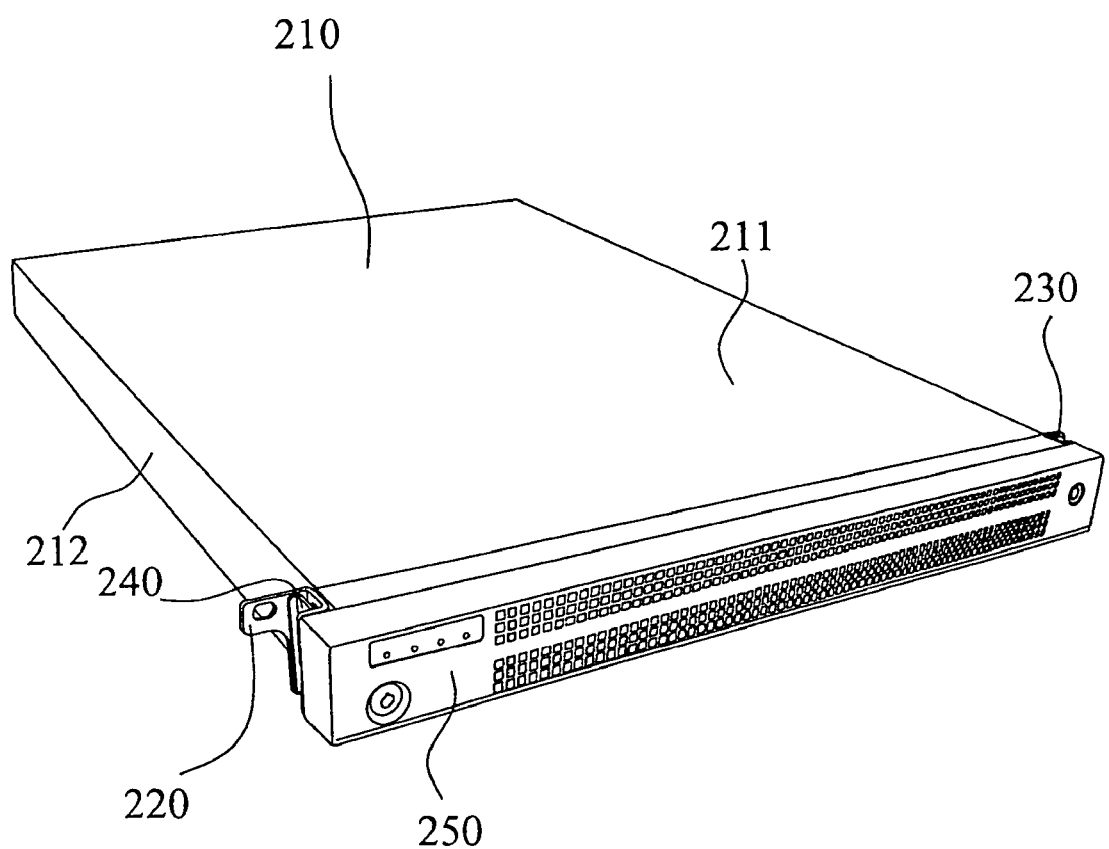
FIG. 2 is a perspective drawing of a preferred embodiment according to the present invention.
Figure 3A:
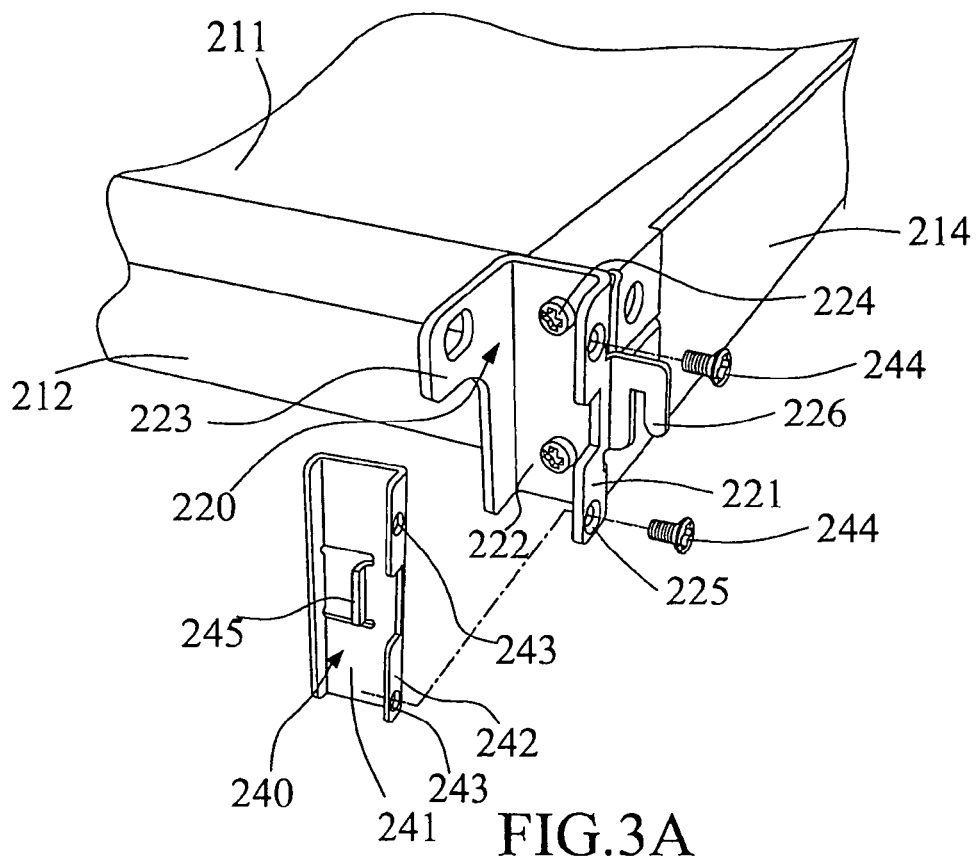
FIG. 3A, FIG. 3B and FIG. 3C are schematic drawings of the embodiment depicted in FIG. 2.
Figure 3B:
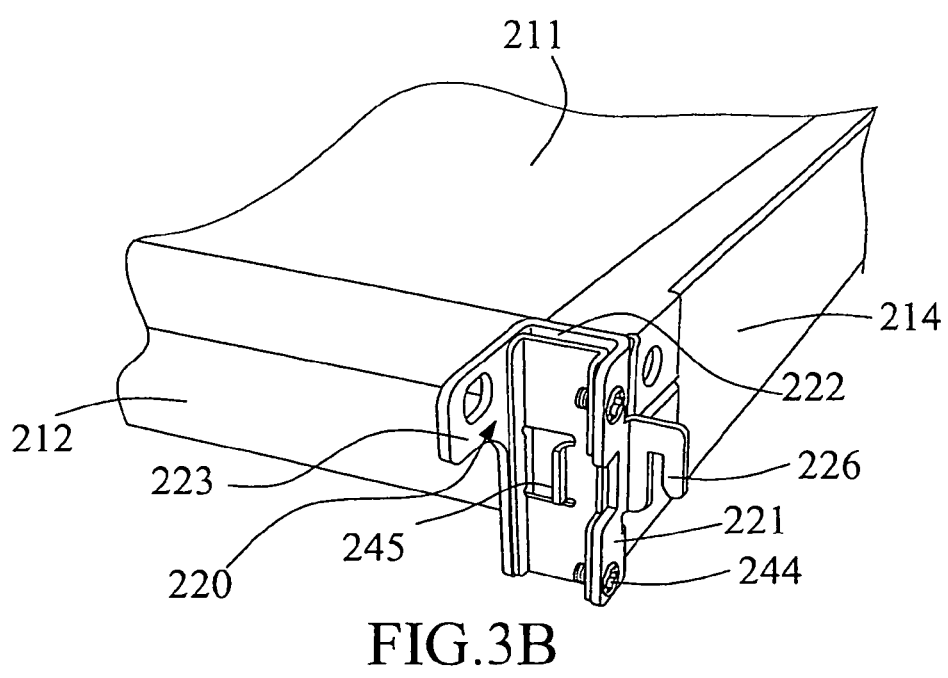
Figure 3C:
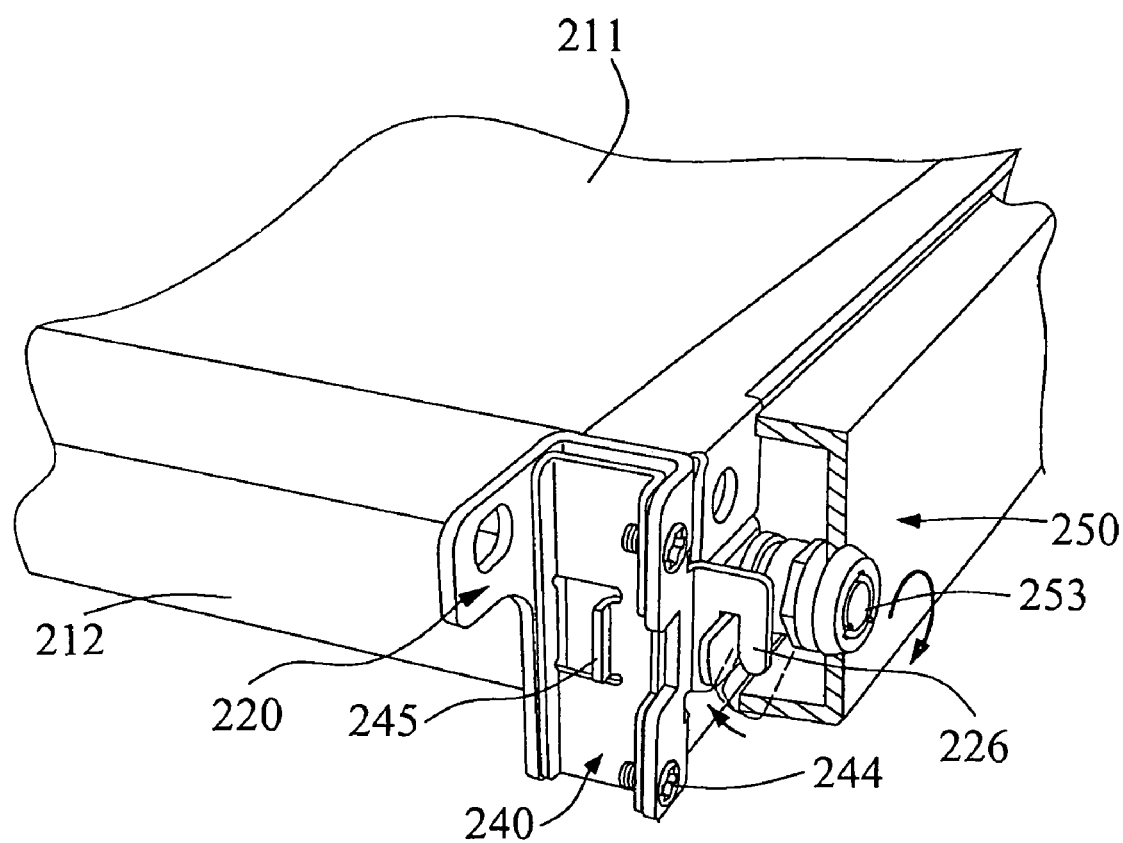
Figure 4:
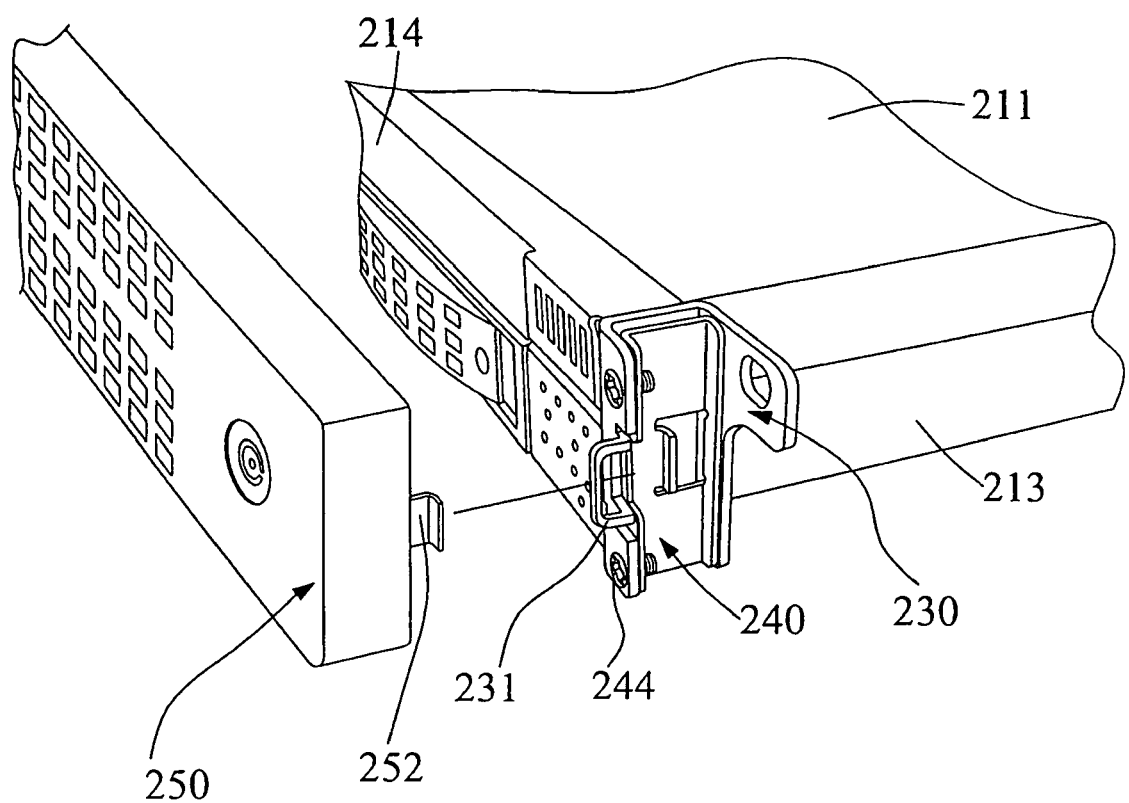
FIG. 4 is another schematic drawing of the embodiment depicted in FIG. 2.

In the present invention, a front cover protector preferably comprises two connecting mechanisms with a second side board of the two connecting mechanisms having a symmetrical shape and used as a track part for a housing of a server. The front cover protector has at least one shield, and preferably two shields, mounted inside the two connecting mechanisms to cover a plurality of screws fixing the connecting mechanisms to a housing of the server. A first fastening mechanism is a hook, and a second fasten mechanism is a slot corresponding to the hook. A first assembly fastening mechanism is a hook, and a second assembly fastening mechanism is a hole corresponding to the hook. A first locking element is an access sheet turned by a key, and a second locking element is a slot for the key to turn the access sheet therein. The second fastening mechanism, the second assembly fastening mechanism and the second locking element are all integrated with the connecting mechanism or the shields. The second locking element is preferably integrated with the connecting mechanism, the second fastening mechanism is preferably integrated with the shield, and the second assembly fastening mechanism is preferably mounted protruding from and integrated with the connecting mechanism.

The following description provides two embodiments to further explain the present invention.

Embodiment 1

Please refer to FIG. 2, FIG. 3A, FIG. 3B, and FIG. 4. In this embodiment, a front cover protector is mounted on a housing 211 of a server 210, which comprises a first connecting mechanism 220, a second connecting mechanism 230, two shields 240, and a front cover 250. The first connecting mechanism 220 and the second connecting mechanism 230 are U-shaped and form a first side board 221, a second side board 223 and a bottom board 222, and the bottom board 222 is fixed respectively on a first front side board 212 and a second front side board 213 of the server 210, and each of the connecting mechanism forms two fixing holes 225 on the first side board 221. The first connecting mechanism 220 further comprises a second locking element 226, which is a slot, and the second connecting mechanism 230 further comprises a second assembly fastening mechanism 231, which is a hole.

Two shields 240 are mounted respectively inside the first connecting mechanism 220 and the second connecting mechanism 230, and further comprise a bottom face 241 and a first side face 242. The bottom face 241 covers a plurality of screws 224 on the bottom board 222 of the first connecting mechanism 220 and the second connecting mechanism 230 and forms a second fastening mechanism 245, which is a slot on the bottom face 241 of the shields 240. The first side face 242 has a related hole 243, corresponding to fixing holes 225 on the first side board 221 so that a fixing screw 244 can be screwed through the fixing hole 225 of the connecting mechanism and the related hole 243 of the shield 240 to mount the shield 240 to the connecting mechanism.

A front cover 250 comprises a first fastening mechanism that is a hook, a first assembly fastening mechanism 252 that is a hook and a first locking element 253 that is an access sheet capable of being turned by a key. The first fastening mechanism can be fastened with the second fastening mechanism 245; the first assembly fastening mechanism 252 can be fastened with the second assembly fastening mechanism 231, and the first locking element 253 can be locked with the second locking element 226. The front cover 250 covers a front face 214 of the server 210 and further covers the fixing screws 244. The entire assembly process includes: fastening the first fastening mechanism and the second fastening mechanism 245 together, then fastening together the first assembly fastening mechanism 252 and the second assembly fastening mechanism 231, and finally locking the first locking element 253 and the second locking element 226 together.

Embodiment 2

Figure 5:
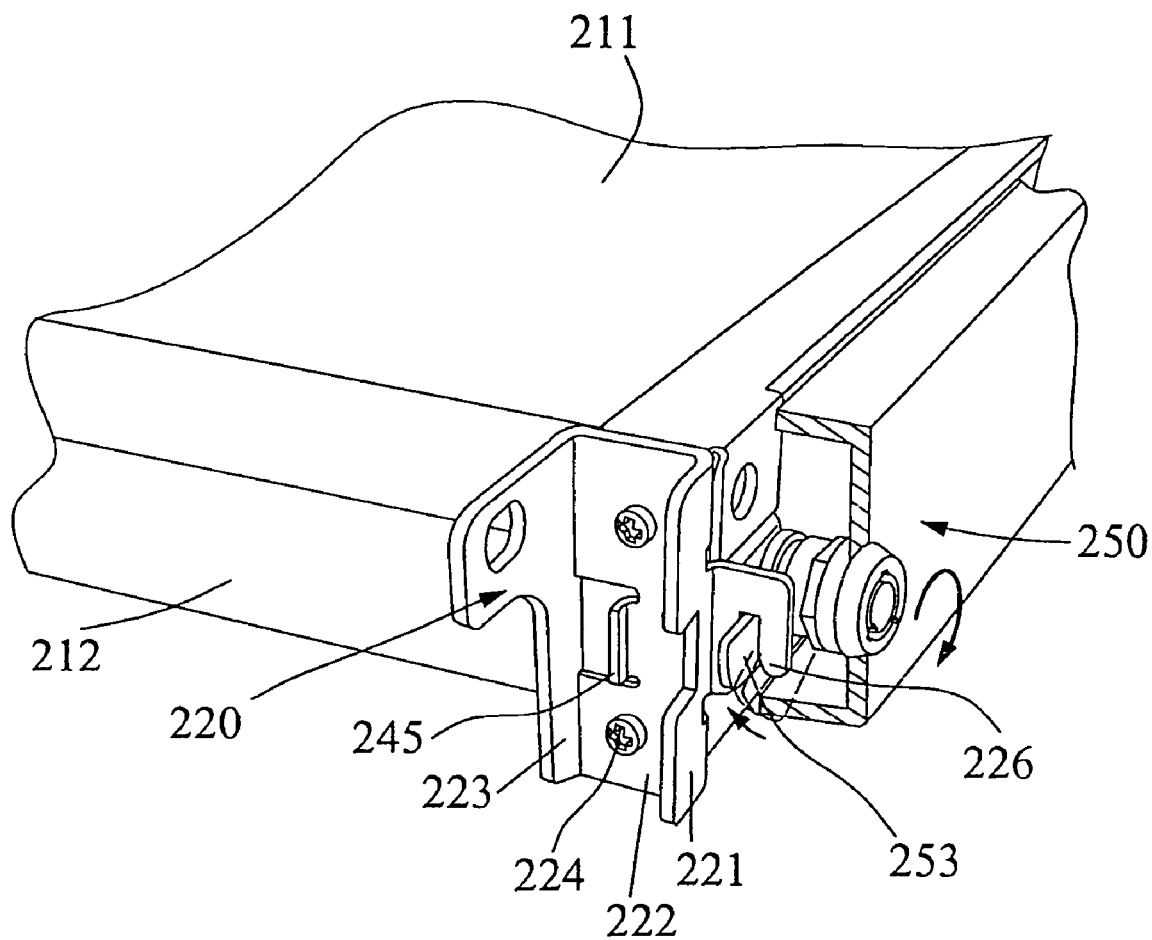
FIG. 5 is a schematic drawing of another embodiment according to the present invention.
Figure 6:
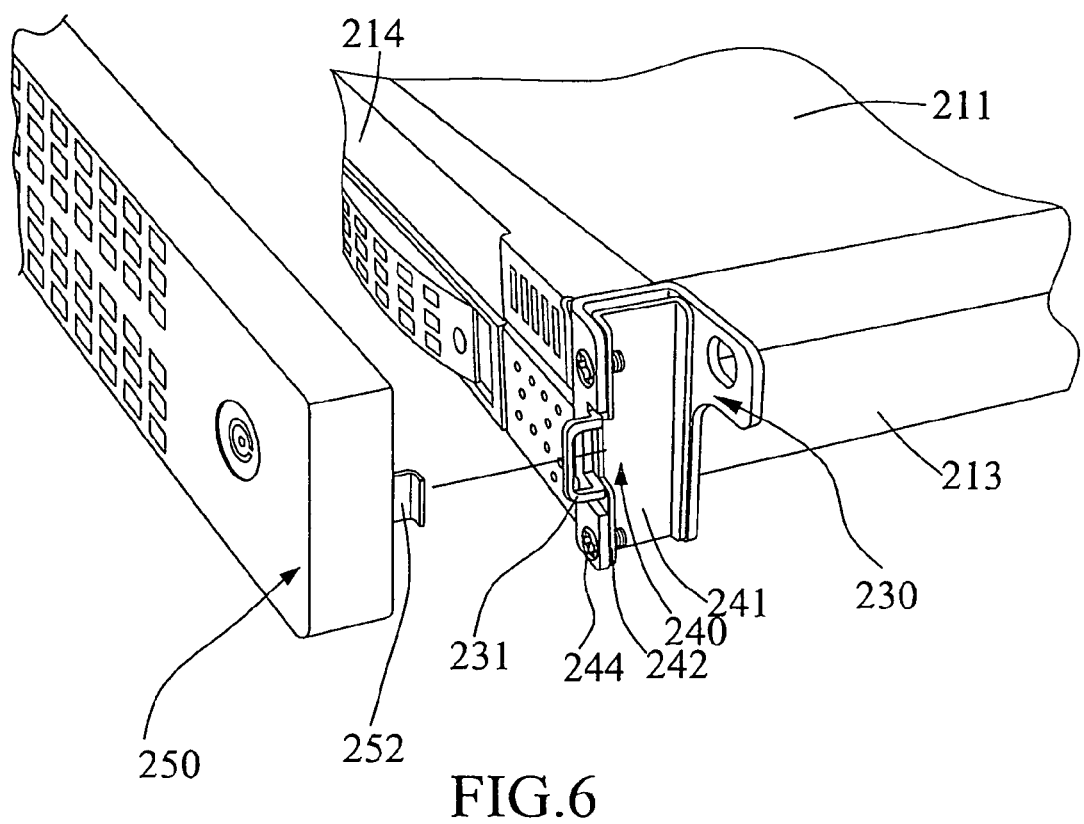
FIG. 6 is another schematic drawing of the embodiment depicted in FIG. 5.

Please refer to FIG. 5 and FIG. 6. In this embodiment, a front cover protector is mounted on a housing 211 of a server 210, which comprises a first connecting mechanism 220, a second connecting mechanism 230, a shields 240, and a front cover 250. The first connecting mechanism 220 and the second connecting mechanism 230 are U-shaped and form a first side board 221, a second side board 223 and a bottom board 222, and the bottom board 222 is fixed respectively on a first front side board 212 and a second front side board 213 of the server 210. The first connecting mechanism 220 further comprises a second locking element 226, which is a slot, and the second fasten mechanism 245, which is a slot. The second connecting mechanism 230 further comprises two fixing holes on the first side board 221, and a second assembly fastening mechanism 231, which is a hole.

The shield 240 is mounted inside the second connecting mechanism 230 and further comprise a bottom face 241 and a first side face 242; the bottom face 241 covers a plurality of screws 224 on the bottom board 222 of the second connecting mechanism 230. The first side face 242 has a related hole corresponding to fixing holes on the first side board 221 so that a fixing screw 244 can be screwed through the fixing hole of the connecting mechanism and the related hole of the shield 240 to mount the shield 240 to the connecting mechanism.

A front cover 250 comprises a first fastening mechanism that is a hook, a first assembly fasten mechanism 252 that is a hook, and a first locking element 253 that is an access sheet capable of being turned by a key. The first fastening mechanism can be fastened with the second fastening mechanism 245; the first assembly fastening mechanism 252 can be fastened with the second assembly fastening mechanism 231, and the first locking element 253 can be locked with the second locking element 226. The front cover 250 covers a front face 214 of the server 210 and further covers the fixing screws 244. The entire assembly process includes: fastening the first fastening mechanism and the second fastening mechanism 245 together, then fastening together the first assembly fastening mechanism 252 and the second assembly fastening mechanism 231, and finally locking together the first locking element 253 and the second locking element 226.

In the above-mentioned embodiments, after the assembly process, the two connecting mechanisms cannot be detached directly; the key is required to open the front cover to remove parts from the server. Consequently, the present invention prevents parts from being stolen. Furthermore, since the screws fixing the connecting mechanisms are covered by the shields, and fixing screws for fixing the shields are covered by the front cover, the front cover protector requires the key to be opened, security for the server is significantly improved.

Although the present invention has been explained in relation to its preferred embodiment, it is to be understood that many other possible modifications and variations can be made without departing from the spirit and scope of the invention as hereinafter claimed.

What is claimed is:

1. A front cover protector mounted on a housing of a server, comprising:
   two connecting mechanisms being in a U shape and forming a first side board, a second side board and a bottom board, the bottom boards being fixed respectively on a first front side board and a second front side board of the server by at least one screw, and forming at least one fixing hole on the first side board;
   at least one shield mounted inside the connecting mechanisms and having a bottom face and a first side face, the bottom face covering the screw on the bottom board of the connecting mechanism and forming a related hole corresponding to the fixing hole of the first side board;
   a fixing screw disposed through the fixing hole of the connecting mechanism and the related hole of the shield to mount the shield to the connecting mechanism;
   a front cover having a first fastening mechanism, a first assembly fastening mechanism and a first locking element, wherein the front cover covers a front face of the server and the fixing screw;
   a second fastening mechanism mounted outside of the first front face of the server corresponding to the first fastening mechanism and stuck with the first fastening mechanism, and connected to the connecting mechanism or the shield;
   a second assembly fastening mechanism mounted outside of the second front face of the server corresponding to the first assembly fastening mechanism, the second assembly fastening mechanism stuck with the first assembly fastening mechanism, and connected to the connecting mechanism or the shield; and
   a second locking element connected to the connecting mechanism or the shield, and mounted corresponding to the first locking element and locked with the first locking element.

2. The front cover protector as claimed in claim 1, wherein the second side boards of the two connecting mechanisms have symmetrical shapes and are used as track parts for the housing of the server.

3. The front cover protector as claimed in claim 1 comprising two shields respectively mounted inside the two connecting mechanisms.

4. The front cover protector as claimed in claim 1, wherein the first fastening mechanism is a hook and the second fastening mechanism is a slot corresponding to the hook.

5. The front cover protector as claimed in claim 1, wherein the first assembly fastening mechanism is a hook and the second assembly fastening mechanism is a hole corresponding to the hook.

6. The front cover protector as claimed in claim 1, wherein the first locking element is an access sheet capable of being turned by a key, and the second locking element is a slot for the key to turn the access sheet therein.

7. The front cover protector as claimed in claim 1, wherein the second locking element is integrated with the connecting mechanism.

8. The front cover protector as claimed in claim 1, wherein the second locking element is integrated with the shield.

9. The front cover protector as claimed in claim 1, wherein the second assembly fastening mechanism is mounted protruding from and integrated with the connecting mechanism.

* * * * *